United States Patent [19]

Bert et al.

[11] 3,903,486

[45] Sept. 2, 1975

[54] ELECTRO-ACOUSTIC DELAY DEVICE FOR HIGH-FREQUENCY ELECTRIC SIGNALS

[75] Inventors: Alain Bert; Gerard Kantorowicz, both of Paris, France

[73] Assignee: Thomson-CSF, Paris, France

[22] Filed: July 25, 1974

[21] Appl. No.: 491,854

[30] Foreign Application Priority Data

July 31, 1973 France .............................. 73.27983

Aug. 2, 1973 France .............................. 73.28287

[52] U.S. Cl. .................. 333/30 R; 310/8.2; 310/9.8; 315/3; 315/4; 250/492 A

[51] Int. Cl.$^2$. H03H 9/26; H03H 9/30; H01J 31/04; H04R 17/10

[58] Field of Search .............. 333/30 R, 72; 310/8.2, 310/8, 8.1, 9.7, 9.8; 250/396, 398; 315/3, 4, 8.5, 5.24, 3.5; 313/369; 340/173 R, 173.2, 173 CR

[56] References Cited

UNITED STATES PATENTS 3,662,355 5/1972 Kazan ............................ 343/173 R 3,689,782 9/1972 Epszein ............................... 310/8.1

*Primary Examiner*—James W. Lawrence

*Assistant Examiner*—Marvin Nussbaum

*Attorney, Agent, or Firm*—Roland Plottel

[57] ABSTRACT

In contrast to prior art delay devices using a piezoelectric crystal, wherein the input and output transducers are conductors applied to the piezoelectric crystal, the invention provides for at least one of these transducers (e.g., 123 in FIGS. 2, 3 and 5) to be partly made up of a system of regions (30) of an insulator (10) covering the crystal (2) and which are rendered conductive when bombarded by an electron beam (from gun 20).

The invention will find application in the production of variable delays, and in particular to pulse compression and filtering.

20 Claims, 5 Drawing Figures

ELECTRO-ACOUSTIC DELAY DEVICE FOR HIGH-FREQUENCY ELECTRIC SIGNALS

The invention relates to a novel delay device for high-frequency electric signals.

The delay devices in question (also called electromechanical device) use a piezoelectric material, usually in the form of a parallelpipedal wafer obtained, e.g., by cutting a quartz crystal in a privileged direction. The electric signal to be delayed is applied at one place in the material by an input transducer, and the delayed signal is collected at another place by an output transducer. The piezoelectric member transmits a mechanical wave or Rayleigh wave or Bleustein wave at its surface at the same frequency as the signal injected into the input transducer; the wave induces in the output transducer a signal which is somewhat delayed with respect to the input signal. In the case of a given piezoelectric material, the delay depends on the distance between the two transducers.

In prior-art devices, the transducers are electrodes in the form of conductors disposed on the surface of the piezoelectric material and occupying stationary positions thereon. Conventionally, the electrodes consist of metal deposits made on the piezoelectric material.

The invention relates to electromechanical delay devices for high-frequency signals wherein at least one of the transducers comprises electrodes formed by parts of an electrically insulating material which have been made conductive, which material covers the piezoelectric substrate. The conductivity is obtained by bombarding the material by a beam of electrons.

The invention takes advantage of the property of certain electrically insulating substances of being made conductive by electron bombardment. This property is known as induced conductivity.

In the devices according to the invention, the bombardment can be varied so as to modify the characteristics of the transducer in question, e.g., to limit the time during which it exists or its position on the bombarded surface, taking advantage of the flexibility provided by electron guns of the kind known in electronics.

It is thus possible, more particularly when using an input transducer occupying a stationary position on the piezoelectric member, to obtain a delay which can be adjusted in accordance with the movement of the output transducer produced by the bombardment.

The invention will be described with reference to an example corresponding to the last-mentioned case, although of course it is not limited to the example but applies in general to the processing of high-frequency signals by transmitting a wave on the surface of a piezoelectric medium.

Figure 1:
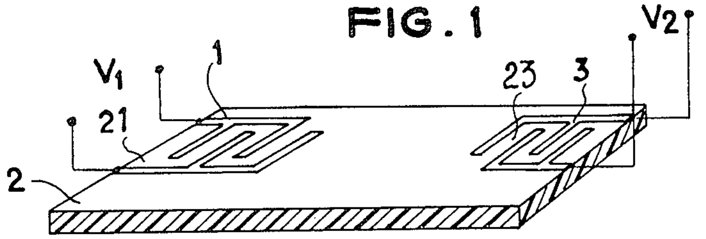
Figures 2, 4:
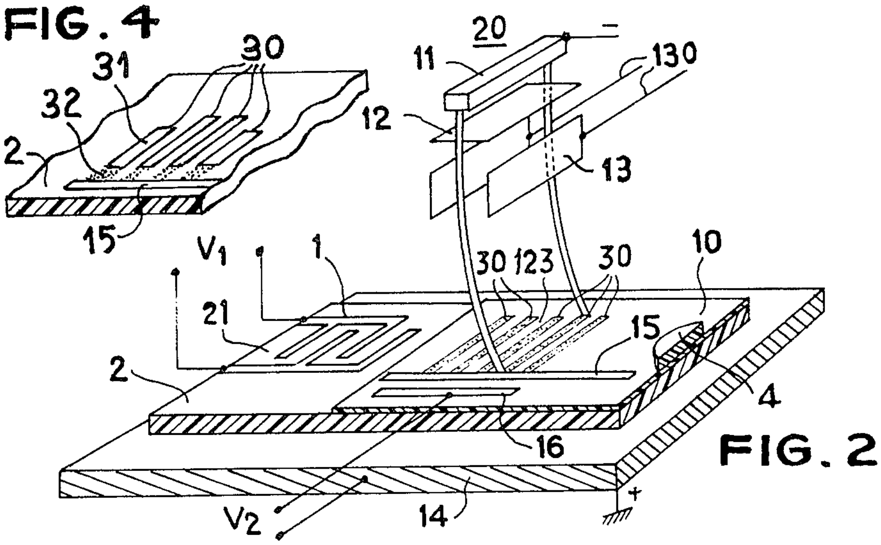
Figure 3:
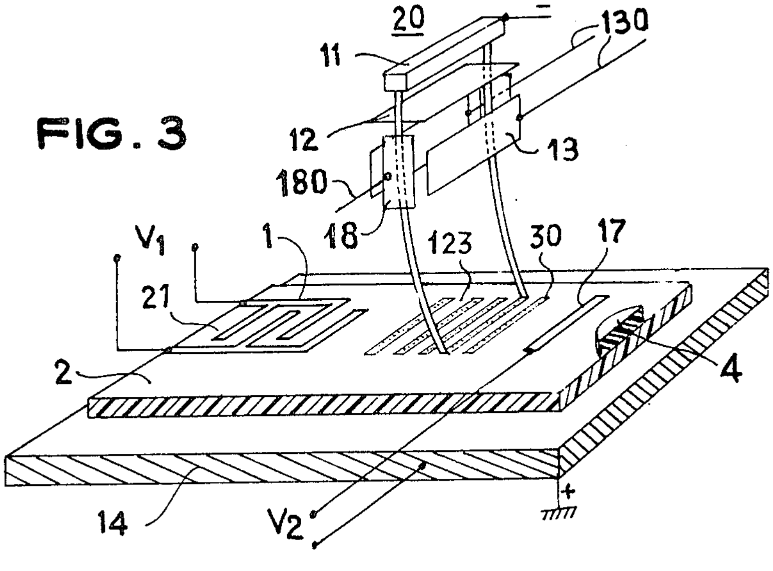
Figure 5:
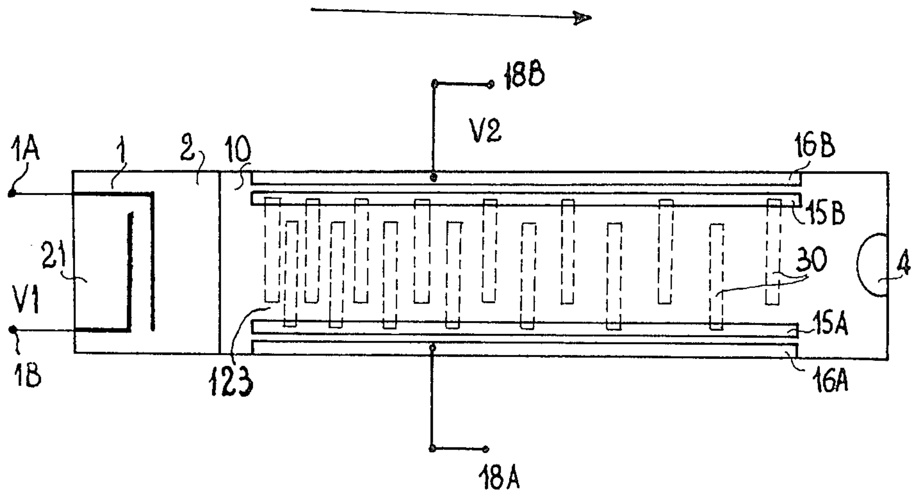

The invention will be more clearly understood by referring to the following description and the accompanying diagrammatic drawings in which;

FIG. 1 shows the basic features of a delay line comprising a piezoelectric crystal for high-frequency signals, FIGS. 2 and 3 shows two alternative embodiments of the invention, FIG. 4 shows a detail of other embodiments of the invention and FIG. 5 shows another embodiment of the invention.

FIG. 1 is a very diagrammatic view of a delay line for electric signals using a piezoelectric crystal. FIG. 1 shows a support 2 in the form of a wafer of electrically insulating piezoelectric material cut, e.g., from a quartz crystal. Reference 1 in FIG. 1 denotes the system of electrodes used to apply an input signal $V_1$; in the drawing, the system of electrodes is in the form of interdigital combs obtained, e.g., by depositing metal on support 2, corresponding to the case of microwave input signals. The input transducer 21 comprises the aforementioned electrode system 1 and the portion of crystal underneath it.

Reference 3 denotes an electrode system, likewise made up of interdigital combs, having terminals to which the output signal $V_2$ is applied, and cooperating with the underlying part of the crystal to form the output transducer 23.

We shall give only a very brief description of the operation of the aforementioned line, since it is substantially known from the prior art.

When an input signal $V_1$ is applied to the electrode system 1, a mechanical wave appears in the piezoelectric material forming wafer 2 and propagates on the surface thereof in the same manner as acoustic waves in elastic media. The wave, which reproduces the applied signal $V_1$, propagates in wafer 2 and in turn produces a potential wave which accompanies the mechanical wave and moves along the wafer between the input transducer and the output transducer, at a speed characteristic of the piezoelectric material. When the potential wave reaches the electrode system 3, it induces an output signal $V_2$ at the terminals of electrodes 3.

FIG. 2 diagrammatically shows an alternative embodiment of the adjustable delay device according to the invention.

FIG. 2 shows components 1 and 2 as before. FIG. 2, however, shows a different output transducer, which had an electrode system 3 in FIG. 1. In the device according to the invention shown in FIG. 2, the electrode system 3 is replaced by a regularly spaced system of parallel strips 30 disposed on the surface of wafer 2 and given temporary electric conductivity in a manner which will be described hereinafter.

To this end, the device in FIG. 2 comprises components 1 and 2 and also comprises an assembly for producing the regularly spaced electrode system.

The assembly comprises the following:

A thin layer 10 of a material having high electric resistance, e.g., a semi-conductor, covering one surface of wafer 2, leaving part of the surface free to receive the electrode system 1, the other surface of wafer 2 being in contact with an electrically conductive electrode 14; and means 20 for producing a beam of electrons impinging on film 10 and moving the point of impact on the film.

The last-mentioned means are known in electronics, i.e., they comprise a thermionic cathode 11 having a heating filament (not shown) a control grid 12, an anode 13 and deflecting electrodes which, in the example, are incorporated in anode 13, which is in two parts as shown in the drawing. Sources (not shown) are used to bring the different electrodes to the required potentials during operation. The sources are a high-voltage source whose negative terminal is connected to cathode 11 and whose positive terminal is connected to electrode 14 (earth); a source which, during operation, brings the control grid 12 to a potential intermediate between that of the cathode and earth; and a source supplying the deflection voltage applied by connections 130 between the two parts of anode 13. A collector collects the secondary electrons emitted by layer 10 as a result of this impact and regulates the potential of the layer. To avoid complicating the drawings, the collector has not been shown; it can be embodied in a number of ways, e.g., a grid parallel to the layer 10 through which the incident electrons travel, or a conductive deposit on the periphery of layer 10, or any other embodiments known in electron tube technology. In the drawing, the beam of electrons produced is shown merely by two pairs of curved lines from cathode 11 to film 10, whereas the impacts of the beam on film 10 are represented by small dotted rectangles 30.

In FIG. 2, reference 4 denotes a layer of material which can absorb the mechanical wave and is deposited on film 10, thus preventing the wave from being reflected. The material can, e.g., comprise silica balls or a titanium ceramic.

The device in FIG. 2 operates as follows:

The electron beam bombards the surface of layer 10, which is made, e.g., of cadmium sulphide, the bombardment energy being several kilovolts, e.g., 4 kV. As a result of the bombardment, the conductivity of layer 10 increases at the point of impact of the beam, since free charge carriers are produced in the mass of the layer under ths surface where the electrons impinge, the number of carriers depending on the material of which the film is made. In the case of cadmium sulphide CdS and in the case of the aforementioned acceleration voltage, the number of carriers is about 1,000 times as great as the number of incident electrons. The free carriers are distributed in the material to a depth not exceeding one tenth of a micron.

In the case of a beam having an intensity of 1 microampere, a pulse lasting, e.g., 10 microseconds and an impact cross-section of approx. $10 \times 0.03$ mm (the dimensions of rectangles 30), the number of free carriers produced per pulse is about $2 \times 10^{18}$ per cubic centimetre, corresponding to a resistivity of the order of $0.1$ ohm $\times$ cm.

Actually, the density of free carriers in the volume in question is less than the aforementioned value, partly because some of the incident electrons are reflected and partly because free carriers diffuse outside the previously defined volume, i.e., the volume of the parallelepipeds whose bases are the rectangles 30 and whose height is equal to the aforementioned depth.

Of course, the material of layer 10 also emits secondary electrons as a result of the impact of the incident electrons. The secondary emission, however, is very small in the case of the aforementioned material under the aforementioned conditions, and relates only to low-energy electrons. These electrons fall back to layer 10 and absorb a small part of the energy of the transmitted wave.

These two facts result in a slight increase in the resistivity beyond the previously given value.

The beam of electrons from cathode 11 is chopped by grid 12 into pulses each lasting 10 microseconds and repeating every thousandth of a second. The two plates forming electrode 13 scan at the mains frequency, i.e., 50 cycles per second, the beam making an outward and a return movement, each lasting 1/100 second, during each cycle. During this period, there are 10 pulses from the control grid, each corresponding to a strip 30. During each scanning cycle, therefore, 10 strips 30 are produced on layer 10, although, for simplicity, only a few have been shown. The parallel conductive strips form the teeth of a comb which, in the devices according to the invention, forms part of the output transducer 123. In the embodiment of the invention shown in FIG. 2, the comb also comprises an electrode 15 on layer 10, electrode 15 also being in the form of a strip and in contact with one end of the previously mentioned strips, as shown in the drawing.

According to the invention, the combs forming transducer 23 in prior-art devices such as shown in FIG. 1 in the form of conductors secured to the piezoelectric metal, are replaced by a comb 123 whose teeth are strips of layer 10 which are made conductive by the impact of the electron beam. The conductivity of the strips is renewed at each transit of the electron beam; the strips remain permanently conductive during scanning, provided that the recombination time of the free carriers produced in the insulating layer 10 during the transit of the electron beam over a strip is substantially greater than the time between two successive transits of the beam along the strip. The beam, therefore, moves again along the strip before the conductivity of the strip resulting from the previous transit has had time to disappear, owing to the recombination of the free carriers. In order to obtain satisfactory operation, the recombination time should also be substantially greater than the period of the acoustic wave. The first condition can easily be obtained using the aforementioned data and, as we shall see, involves the second condition at the operating frequencies.

The conductivity, however, disappears if the strip is not scanned for a time greater than the time required for combination. The conductivity therefore disappears quite quickly (in a few thousandths of a second in the case given). Consequently, after a number of strips 30 have been formed or "inscribed" on semiconductor 10, they can be "erased" by ceasing to maintain them by electron beam, i.e., the output transducer can be erased and a different series, i.e., a different comb in a different position on layer 10, can be produced by altering the voltages applied to the electrodes of gun 20. Consequently, after a first series of strips 30 have been produced, a different series can be produced without the device retaining a trace of the first series. In other words, the output transducer 123 in devices according to the invention can be moved when necessary with respect to the stationary input transducer 21, thus adjusting the delay in the high-frequency signal between the input and the output of the device. The delay is decreased by moving the output transducer towards the left in the drawing and increased by moving it towards the right.

Transducer 123 is temporarily kept in the position corresponding to the desired delay.

The device according to the invention can move transducer 123 in a particularly easy manner, using deflecting electrodes 13 under conditions which are familiar to the expert in electron tubes.

In the example given, the width of the output comb teeth, i.e., the width of rectangles 30, was of the order of half the wavelength of the acoustic wave propagating in the piezoelectric wafer 2, i.e., 0.03 mm in the previously described case of a high-frequency signal of 50 MHz and a propagation speed of 3,000 m/s by the wave in the piezoelectric material.

Scanning was adjusted so as to obtain strips separated by spaces (the distance between the central lines of rectangles 30) equal to the wavelength of the acoustic wave in the piezoelectric material. The same result could have been obtained using strips 30 spaced apart by a multiple of the same wavelength.

In other respects, the device in FIG. 2 operates in the same manner as the device in FIG. 1. The potential wave accompanying the acoustic wave propagated by the piezoelectric crystal induces a signal in the comb formed by conductive strips 30 and electrode 15. An electrode 16 is disposed on the semiconductive layer 10 in the immediate neighbourhood of electrode 15, to which it is capacitatively coupled. The output signal $V_2$ is sampled between electrode 16 and the earth electrode 14. The drawings do not show the negative-pressure casing inside which the electron bombardment occurs.

In the device according to the invention, the thickness of the semiconducting layer 10 is made much less than the length of the acoustic wave propagated by the piezoelectric crystal 2, so as not to interfere with the propagation of the wave, which occurs at the surface separating crystal 2 from layer 10.

Incidentally, we assume (as is the case more particularly with cadmium sulphide) that the diffusion length of the free carriers outside the volume in which they are produced is small compared with the thickness of the electron beam, i.e., the width of rectangles 30. In the example given, the diffusion length is a fraction of a micron whereas the width of the rectangles is 30 microns, as stated previously.

FIG. 3 shows another embodiment of the device according to the invention, wherein the output signal is sampled on an electrode 17, which is also in the form of a strip disposed parallel to strips 30 on wafer 2 as shown in the drawing. The latter embodiment is simpler than that in FIG. 2 but the total variation in the delay which it provides is not as great as in FIG. 2, since when strips 30 are moved to the left of the drawing in order to reduce the delay, there is a simultaneous reduction in the coupling between strip 17 (which occupies a stationary position) and the system of strips 30, and a consequent reduction in the level of the output signal. Electrode 17 receives the output signal by being capacitatively coupled to the output transducer 123.

In FIG. 3, the layer 10 in FIG. 2 is omitted; this can be done if wafer 2 is made of a material which is both piezoelectric and has induced conductivity, e.g., cadmium sulphide or gallium arsenide.

In the preceding examples, teeth 30 of comb 123 were entirely made up of regions which were made conductive at the surface of the piezoelectric material. According to the invention, however, the strips may alternatively be made up partly of conductors 31, which are formed at the surface of the piezoelectric material or the induced-conductivity material covering it, and partly of regions 32 which are made conductive by electron bombardment as shown by the detail in FIG. 4, in which like components bear the same references as in the preceding drawings.

In the embodiment of FIG. 4, the means 20 would be adapted to the dimensions of the regions to be obtained; they need not be substantially different from those used in FIGS. 2 and 3 since they differ therefrom only in detail, which can be understood by the skilled addressee.

In FIG. 4, the delay can likewise be adjusted if the series of strips 31 forming part of the output transducer is selected for each required delay; the only strips being effective are those connected to electrode 15 via an induced-conductivity region 32 bombarded by the beam.

In some applications, strips 30 can be of unequal length, in which case the length of the strips will be adjusted by a system of two additional plates forming electrode 18 (FIG. 3) disposed on either side of anode 13 and adapted to vary the width of the beam of electrodes (shown by the curved lines only) using a source (not shown) connected to the supplementary plates by connections 180 under conditions known to the expert in electron guns.

If necessary, the width of strips 30 can also be varied in known manner, as in FIG. 4.

In FIG. 2, the output transducer comprises a comb formed by conductive strip 15 and teeth 30. This shape has been given by way of example; of course, without departing from the invention, the transducer could be given very different shapes, and more particularly could comprise two facing combs instead of one, the teeth of one comb being disposed between the teeth of the other in an interdigital arrangement known in microwave technology.

The preceding remarks apply to the case where the output transducer and the input transducer are reversed, the output transducer being stationary and the input transducer being formed by induced conductivity and movable with respect to the output transducer.

The preceding remarks also apply to the case where the input and output transducers are both formed by induced conductivity and are both movable on the surface of the piezoelectric member.

It will be now shown on examples how the use of transducers of the aforementioned kind greatly facilitates the application of the aforementioned devices to certain problems of processing high-frequency signals, such as compressing or lengthening pulses and filtering signals.

The operation of the devices, when they are applied to solving among others the aforementioned problems, will be described from the drawing of FIG. 5, which is a diagrammatic plan view.

The drawing non-limitatively shows a device wherein the output transducer is similar to those in the preceding drawings using induced-conductivity strips 30. However, the drawing can easily be used to explain the prior-art functioning process, as disclosed in the article by R. H. Tancrell and M. G. Holland, "Acoustic Surface Wave Filters" in the periodical PIEEE 1971, 59 more particularly pages 393–409, to which reference may be made, wherein the input and output transducers occupy stationary positions on the piezoelectric member.

The drawing of FIG. 5 shows some components of the preceding drawings, in a similar form and using the same references. 15A and 15B are conductive strips completing the interlocking combs forming the output transducer 123; 16A and 16B are other metal conductors capacitatively coupled to the previously mentioned conductors in order to sample the output signal $V_2$ between terminals 18A and 18B outside the negative-pressure casing (not shown) in which the electron beam used in the devices is propagated. The drawing does not show any of the means used to provide the electron bombardment required to obtain conductive strips 30; reference should be made to the preceding drawings. The arrow shows the direction of propagation of the mechanical wave in the piezoelectric member.

Prior-art conditions, wherein the input and output transducers are stationary, can be obtained merely by assuming that the output transducer is constructed, not as shown in the drawing, but from metal combs made, e.g., by depositing metal on the piezoelectric member, as in the case of the input transducer. In that case, terminals 18A and 18B will be directly connected to conductive strips 15A and 15B.

When the signal $V_1$ applied to the input of the device between terminals 1A and 1B of input transducer 1 is in the form of a pulse, which may or may not be frequency-modulated, it is possible (as known from the prior art in the cited article) to collect the different frequencies making up the spectrum of the pulse, at maximum intensity, in the output signal $V_2$, at different places in the output transducer, if the interdigital assembly forming the output transducer is given a pitch at each point which is adapted to the frequency to be collected at that point; the spacing between two adjacent teeth of the interdigital assembly is equal to half the corresponding wavelength. The collected frequencies are separated from one another by time intervals depending on the time taken by waves of different frequencies simultaneously induced by the input transducer in the crystal at the instant when the pulse is applied, to travel, at the speed characteristic of the piezoelectric medium, the distance between the input transducer and those points on the output transducer where the waves are collected. It is thus possible to lengthen or compress a pulse, to filter some of its component frequencies, to reverse the frequencies in time, etc, if the pitch is given a number of discontinuous values in accordance with the desired result.

Accordingly, the devices are filters and are most commonly used for "adapted" filters, which have the advantage of being able to extract a particular signal from the surrounding noise. A well-known example is the pulse-compression filter which supplies a maximum output voltage when the received signal varies in frequency in the same manner as the filter comb.

At a given instant, the components of the different signal frequencies are simultaneously collected at the different points on the output transducer; at the same instant, the components are added to form a signal having a much greater intensity than each of the components and a much larger signal-to-noise ratio than the initial signal.

Another application is the phase-coding filter. As before, the output voltage is at a maximum when the received signal is phase-modulated in time with the filter comb.

If the applied signal is made up of wave trains which are phase-shifted with respect to one another in accordance with the code in question, the regions of the output transducer which are made conductive by bombardment are disposed so as simultaneously to sample all the parts of the signal, i.e., the wave trains in question, with their phase at different points on the output transducer.

The example shown in the drawing of FIG. 5 relates to the case where pulses are compressed. The signal applied to the input transducer 21 is frequency-modulated at a frequency which increases from the beginning to the end of the signal. The output transducer 123 comprises two interdigital combs; as can be seen, the spacing between alternate comb teeth 30 increases continuously from the input to the output of the output transducer, thus providing the conditions for compressing the signal as previously mentioned. When the lowest frequencies at the beginning of the signals reach the points most remote from the output transducer, the highest frequencies reach the input thereof. Consequently the components of the signal are sampled at the same instant and combine to form a high-intensity signal.

In general, induced-conductivity transducers can be used in a very flexible manner to modify the characteristics of the output transducer 123 of a single device, depending on the result to be obtained. This flexibility is particularly useful in the case of phase codes.

Accordingly, the output transducer can have a constant pitch, a continuously variable pitch as in the example of FIG. 5, or a pitch having a number of discontinuous values in the propagation direction, etc.

Furthermore, the length of the conductive strips 30 can be continuously varied or can be given a number of discontinuous values in the propagation direction. Variable lengths of this kind are used, as known in the art, to reduce the amplitude of the secondary lobes in the signal.

In addition, a number of successive teeth of one comb can alternate with one or more successive teeth of the other comb in the output transducer, etc.

Of course, the invention is not limited to the embodiment described and shown which was given solely by way of example.

What is claimed is:

1. A delay electro-acoustic device for high-frequency electric signals using a piezoelectric medium capable of propagating a mechancial wave when an electric signal is applied thereto, the medium being coupled to an input transducer to which the electric signal is applied and an output transducer which collects the signal transmitted by the medium, characterised in that at least one of the transducers is at least partially made up of regions of an electrically insulating material which is made conductive by electron bombardment.

2. A device according to claim 1, characterised in that the regions are of an electrically insulating material covering the piezoelectric medium.

3. A device according to claim 1, characterised in that the regions are in the piezoelectric material itself.

4. A device according to claim 1, characterised in that the regions are rectangles which are elongated in the direction perpendicular to the direction of propagation of the mechanical wave in the piezoelectric medium, the rectangles being parallel to one another.

5. A device according to claim 4, characterised in that any transducer among said transducers which is at least partly made up of the aforementioned regions, also comprises at least one conductive strip parallel to the direction of propagation of the mechanical wave and in contact with the aforementioned rectangles at one end thereof.

6. A device according to claim 5, characterised in that said transducer at least partially made up of the aforementioned regions also comprises other conductive strips in contact with the aforementioned regions and having the same width of the regions, the strips being disposed in the prolongation of the regions and situated with respect to the regions on the side opposite the conductive band and parallel to the direction of propagation.

7. A device according to claim 6, characterised in that each assembly formed by one of the regions and the conductive strip which prolongs it has the same length as the others.

8. A device according to claim 4, characterised in that the regions also have the same width.

9. A device according to claim 5, characterised in that the device comprises a second conductive strip in contact with the surface of the device which is bombarded by the electron beam and parallel thereto and in the immediate neighbourhood thereof on the opposite side from the regions, the device also comprising a conductive plate in contact with the other surface of the device; the second strip and the plate are the terminals of the transducer.

10. A device according to claim 4, characterised in that it also comprises a conductive strip parallel to the aforementioned regions and a conductive plate in contact with the other surface of the device, both the strip and the plate being applied to the surface which is bombarded by the electron beam, beyond the regions in the propagation direction of the mechanical wave; the parallel strip and the conductive plate are the transducer terminals.

11. A device according to claim 2, characterised in that the insulating material is cadmium sulphide, CdS.

12. A device according to claim 3, characterised in that the piezoelectric material is cadmium sulphide CdS.

13. A delay device for high-frequency electric signals according to claim 1, characterised in that the input transducer is stationary and the output transducer is at least partially made up of the aforementioned regions.

14. A delay device for high-frequency electric signals according to claim 1, characterised in that the input transducer occupying a stationary position on the piezoelectric medium and said device further comprises means producing an electron beam, means causing the beam to impinge on the aformentioned regions of the electrically insulating material so that, at the point of impact, the beam makes the material conductive by producing free charge carriers therein, means chopping the beam into pulses, the beam impinging on each region during one pulse, means for deflecting the beam so that the regions are spaced out and equidistant from one another, and means ensuring that the regions are periodically scanned by the beam during a period less than the recombination time of the free charge carriers, the device also comprising means associated with the deflection means in order to modify the position of the aforementioned regions on the insulating material.

15. A device according to claim 4, characterised in that the successive spacings between the rectangles in the direction of propagation are adjusted in accordance with each kind of processing applied to the signal.

16. A device according to claim 15, characterised in that the spacing is constant.

17. A device according to claim 15, characterised in that the spacing varies continuously in the propagation direction.

18. A device according to claim 15, characterised in that the spacing has a number of discontinuous values in the propagation direction.

19. A device according to claim 15, characterised in that the length of the rectangles varies continuously from one end to the other of the transducer.

20. A device according to claim 15, characterised in that the length of the rectangles has a number of discontinuous values in the propagation direction.

* * * * *